United States Patent
Hebert et al.

(10) Patent No.: US 11,648,761 B2
(45) Date of Patent: May 16, 2023

(54) CONDUCTIVE FILMS

(71) Applicant: 3M INNOVATIVE PROPERTIES COMPANY, St. Paul, MN (US)

(72) Inventors: Larry S. Hebert, Hudson, WI (US); Timothy D. Norum, River Falls, WI (US); Steven Y. Yu, St. Paul, MN (US); Stephen P. Maki, North St. Paul, MN (US)

(73) Assignee: 3M Innovative Properties Company, St. Paul, MN (US)

( * ) Notice: Subject to any disclaimer, the term of this patent is extended or adjusted under 35 U.S.C. 154(b) by 91 days.

(21) Appl. No.: 16/771,836

(22) PCT Filed: Apr. 15, 2019

(86) PCT No.: PCT/IB2019/053089
§ 371 (c)(1),
(2) Date: Jun. 11, 2020

(87) PCT Pub. No.: WO2019/202472
PCT Pub. Date: Oct. 24, 2019

(65) Prior Publication Data
US 2021/0187927 A1 Jun. 24, 2021

Related U.S. Application Data

(60) Provisional application No. 62/658,823, filed on Apr. 17, 2018.

(51) Int. Cl.
*B32B 43/00* (2006.01)
*B32B 37/00* (2006.01)
(Continued)

(52) U.S. Cl.
CPC ............ *B32B 37/025* (2013.01); *B29C 41/42* (2013.01); *B32B 7/06* (2013.01); *B32B 7/12* (2013.01);
(Continued)

(58) Field of Classification Search
CPC ................. B32B 37/025; B32B 43/006; Y10T 156/1168
See application file for complete search history.

(56) References Cited

U.S. PATENT DOCUMENTS

| 4,113,576 A | 9/1978 | Hutkin |
| 4,366,307 A | 12/1982 | Singh |

(Continued)

FOREIGN PATENT DOCUMENTS

| CN | 103094184 A | 3/2013 |
| CN | 104918414 A | 9/2015 |

(Continued)

OTHER PUBLICATIONS

"Copper Metallurgical Production Technology", edited by He Xiaohong, Metallurgical Industry Press, 1st Edition, Feb. 2017, p. 1.
(Continued)

*Primary Examiner* — Philip C Tucker
*Assistant Examiner* — Nickolas R Harm
(74) *Attorney, Agent, or Firm* — Philip P. Soo

(57) ABSTRACT

A method of making an electrically-conductive film is provided. The method includes providing a release layer, optionally having a topologically structured surface, and depositing at least one electrically-conductive layer on the release layer whereby the at least one electrically-conductive layer has an outer surface that substantially replicates the topologically structured surface. The electrically-conductive layer can be peeled away from the release layer to obtain the electrically-conductive film. Such electrically-conductive films can be useful in lightning strike applications.

17 Claims, 4 Drawing Sheets

(51) Int. Cl.
    *B29C 41/42*     (2006.01)
    *B32B 7/06*     (2019.01)
    *B32B 7/12*     (2006.01)
    *B32B 15/06*     (2006.01)
    *B32B 15/092*     (2006.01)
    *B32B 15/20*     (2006.01)
    *B32B 25/14*     (2006.01)
    *B32B 27/26*     (2006.01)
    *B32B 27/38*     (2006.01)
    *B32B 38/06*     (2006.01)
    *B32B 38/10*     (2006.01)
    *B64D 45/02*     (2006.01)

(52) U.S. Cl.
    CPC ............ *B32B 15/06* (2013.01); *B32B 15/092* (2013.01); *B32B 15/20* (2013.01); *B32B 25/14* (2013.01); *B32B 27/26* (2013.01); *B32B 27/38* (2013.01); *B32B 38/06* (2013.01); *B32B 38/10* (2013.01); *B64D 45/02* (2013.01); *B32B 43/006* (2013.01); *B32B 2274/00* (2013.01); *B32B 2307/202* (2013.01); *B32B 2307/712* (2013.01); *Y10T 156/1168* (2015.01)

(56) References Cited

U.S. PATENT DOCUMENTS

| | | |
|---|---|---|
| 6,401,614 B1 | 6/2002 | Venturati |
| 6,475,616 B1 | 11/2002 | Dietz |
| 6,486,297 B2 | 11/2002 | Zook |
| 6,824,882 B2 | 11/2004 | Boardman |
| 6,924,043 B2 | 8/2005 | Suzuki |
| 8,503,153 B2 | 8/2013 | Hebert |
| 8,922,970 B2 | 12/2014 | Hebert |
| 9,650,150 B2 | 5/2017 | Zook |
| 2004/0069895 A1 | 4/2004 | Pham |
| 2007/0125655 A1 | 6/2007 | Buckley |
| 2010/0070621 A1 | 3/2010 | Urdan et al. |
| 2010/0263898 A1 | 10/2010 | Hebert |
| 2011/0240476 A1 | 10/2011 | Wang |
| 2012/0070621 A1 | 3/2012 | Nukui |
| 2014/0141274 A1 | 5/2014 | Tzou |
| 2014/0202869 A1 | 7/2014 | Hsu |
| 2015/0114551 A1* | 4/2015 | Moritz .................. B32B 27/20 428/335 |
| 2016/0032058 A1 | 2/2016 | Ye |
| 2016/0046052 A1 | 2/2016 | Ito |
| 2016/0121576 A1 | 5/2016 | Sasaki |
| 2017/0239926 A1* | 8/2017 | Paolilli .................. B32B 7/06 |
| 2017/0361508 A1* | 12/2017 | Carter .................. B29C 45/372 |

FOREIGN PATENT DOCUMENTS

| | | |
|---|---|---|
| WO | WO 2006-110489 | 10/2006 |
| WO | WO 2010-121044 | 10/2010 |
| WO | WO 2016-106352 | 6/2016 |
| WO | WO 2016-205134 | 12/2016 |
| WO | WO 2016-205137 | 12/2016 |

OTHER PUBLICATIONS

"Functional Composite Materials", edited by Yin Hongfeng, Beijing Metallurgical Industry Press, 1st Edition, pp. 70-71, Aug. 2013.

Chu-Kure, "Evaluation of Corrosion Resistance of Multilayered $Sn/Ag_3Sn$ Electroplating on Cu Alloys for Electric Connectors", ECS Transactions, 2014, vol. 58, No. 41, pp. 103-113.

Robbiola, "Morphology and Mechanisms of Formation of Natural Patinas on Archaeological Cu—Sn Alloys", Corrosion Science, 1998, vol. 40, No. 12, pp. 2083-2111.

Tu, "Interdiffusion and Reaction In Bimetallic Cu—Sn Thin Films", ACTA Metallurgica, 1973, vol. 21, pp. 347-354.

International Search Report for PCT International Application No. PCT/IB2019/053089, dated Nov. 20, 2019, 6 pages.

* cited by examiner

CONDUCTIVE FILMS

CROSS REFERENCE TO RELATED APPLICATIONS

This application is a national stage filing under 35 U.S.C. 371 of PCT/IB2019/053089, filed Apr. 15, 2019, which claims the benefit of U.S. Provisional Patent Application No. 62/658,823, filed Apr. 17, 2018, the disclosures of which are incorporated by reference in their entirety herein.

FIELD OF THE INVENTION

Provided are electrically-conductive films and methods of making them. More particularly, the provided electrically-conductive films can be suitable for use in lightning strike protection or electronic circuitry.

BACKGROUND

Thin conductive films are used in adhesives and surfacing films for composite structures, such as those found on next generation aircraft. They are used for electromagnetic interference (EMI), electromagnetic compatibility (EMC), and High Intensity Radiated Field (HIRF) shielding as well as current conduction, antenna ground planes and energy reflection.

The lightning strike of an aircraft in flight is not a rare phenomenon. It is estimated that strikes on civilian transport planes amount to about one strike per plane per year. The current trend in aeronautical engineering is to use lighter weight materials, fewer mechanical systems and more electronic systems. Electronic systems are often more sensitive than mechanical systems to electromagnetic disturbances such as those generated by lightning. Recently, electrically non-conductive or partially conductive fiber reinforced resin matrix materials are being used to fabricate more parts for airplanes, as well as for wind generators, automobiles, sporting goods, furniture, buses, trucks and other applications where stiff, light-weight materials, or consolidation of parts are beneficial. These lighter weight structures offer less effective protection against lightning than the traditional aluminum structures.

Conditions at the lightning attachment site are extreme. For lightning attachments to aircraft, electrical current transients as high as 200,000 amperes are expected with charge transfers exceeding 200 coulombs. Lightning attachments to wind generators vary greatly by geographic location and height, but electrical current transients as high as 100,000 amperes are expected with charge transfers as high as 300 coulombs. The temperature of the plasma in the lightning strike column has been estimated to be about 28,000 K.

Much of the damage caused by a lightning strike temperature within the lightning arc and ohmic heating of the materials. Some manufacturers use lightning protection systems which include electrically-conductive layers such as metalized woven fabric, metalized paper, solid metal films, foraminous metal films, metal wires, metal mesh, metal particles, expanded metal foils, carbon particles or carbon fibers. Some investigators report the use of lightning protection systems which include ionizable outer layers, such as paint layers; however, expanded metal mesh is frequently referenced. Electrically-conductive films are described, for example, in U.S. Patent Publication No. 2004/0069895 (Hebert).

Epoxy resin films are sometimes joined with the conductors to create a film which is disposed at, or near, the exterior surface of a part. These epoxy resins often receive their final cure when the composite part is cured and is used to create a smooth surface on the exterior of the composite part, as well as providing a surface onto which primed paint can be applied with good adhesion.

SUMMARY

Provided are methods, and articles made therefrom, in which an electrical conductor is deposited onto a conductive carrier, and the electrical conductor then separated cleanly from the carrier to allow the electrical conductor to be transferred to alternative substrates. This transfer is accomplished without fracturing the electrical conductor, and while retaining the shape imparted from the structured conductive carrier. Advantageously, the structured nature of the electrical conductor enables its use in specialized applications such as in lightning strike protection films.

In a first aspect, a method of making an electrically-conductive film is provided. The method comprises: providing a release layer with a release surface, the release surface optionally being a topologically structured surface; depositing at least one electrically-conductive layer on the release layer whereby the at least one electrically-conductive layer has an outer surface that substantially replicates the release surface; and peeling the at least one electrically-conductive layer away from the release layer to obtain the electrically-conductive film.

In a second aspect, a method of making an electrically-conductive film is provided, comprising: providing a release layer having a major surface, wherein selected portions of the major surface are placed in contact with a masking layer; depositing at least one electrically-conductive layer on the release layer whereby the at least one electrically-conductive layer is selectively deposited on portions not covered by the masking layer; and peeling the at least one electrically-conductive layer away from the release layer to obtain the electrically-conductive film.

In a third aspect, an electrically-conductive films and lightning strike protection films are provided based on the aforementioned methods.

Figure 1:
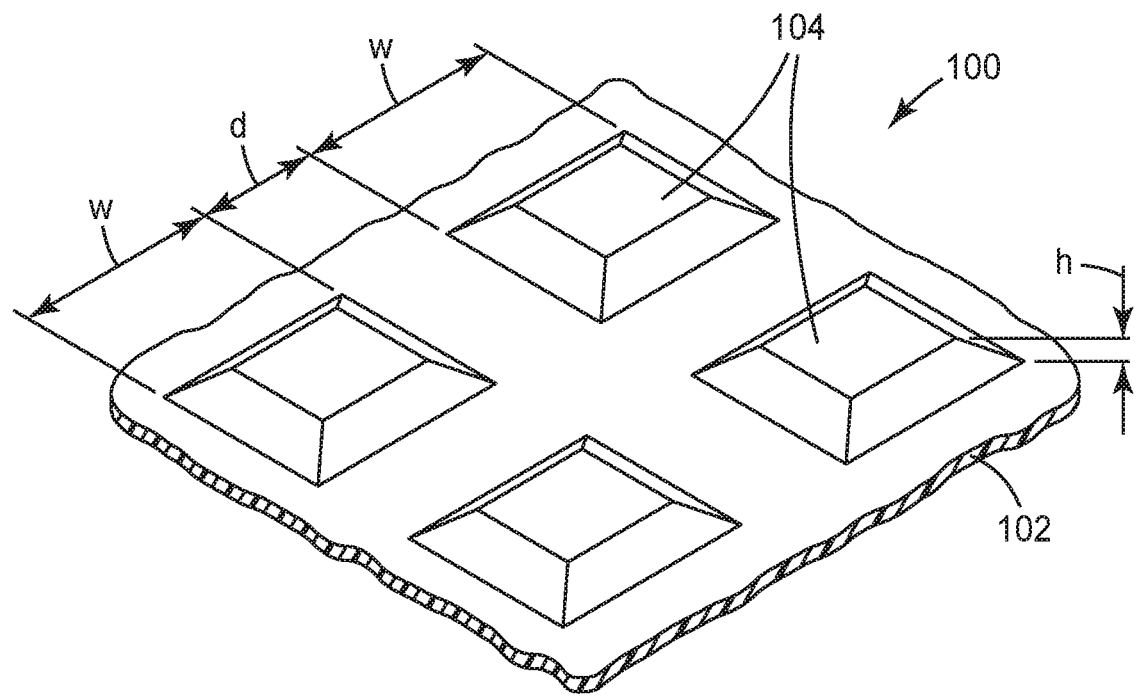
FIG. 1 is an isometric view of a release assembly according to one embodiment.

Repeated use of reference characters in the specification and drawings represents the same or analogous features or elements of the disclosure. Numerous other modifications and embodiments can be devised by those skilled in the art, which fall within the scope and spirit of the principles of the disclosure. The figures may not be drawn to scale.

Definitions

As used herein:

"average" means number average, unless otherwise specified;

"copolymer" refers to polymers made from repeat units of two or more different polymers and includes random, block and star (e.g. dendritic) copolymers;

"cure" refers to exposing to radiation in any form, heating, or allowing to undergo a physical or chemical reaction that results in hardening or an increase in viscosity;

"pattern" refers to any repeating set of features, although often uniform in shape and regularly recurring, these can be non-uniform in shape and/or non-uniform in size and/or irregularly recurring or randomly placed;

"polymer" refers to a molecule having at least one repeating unit;

"substantially" means to a significant degree, as in an amount of at least 50%, 60, 70, 80, 90, 95, 96, 97, 98, 99, 99.5, 99.9, 99.99, or 99.999%, or 100%;

"thickness" means the distance between opposing sides of a layer or multilayered article; and "vacuum deposition" means any of the deposition processes performed largely at pressures below atmospheric such as, but not limited to, sputter deposition, evaporation, physical vapor deposition, and chemical vapor deposition.

DETAILED DESCRIPTION

As used herein, the terms "preferred" and "preferably" refer to embodiments described herein that can afford certain benefits, under certain circumstances. However, other embodiments may also be preferred, under the same or other circumstances. Furthermore, the recitation of one or more preferred embodiments does not imply that other embodiments are not useful, and is not intended to exclude other embodiments from the scope of the invention.

As used herein and in the appended claims, the singular forms "a," "an," and "the" include plural referents unless the context clearly dictates otherwise. Thus, for example, reference to "a" or "the" component may include one or more of the components and equivalents thereof known to those skilled in the art. Further, the term "and/or" means one or all of the listed elements or a combination of any two or more of the listed elements.

It is noted that the term "comprises" and variations thereof do not have a limiting meaning where these terms appear in the accompanying description. Moreover, "a," "an," "the," "at least one," and "one or more" are used interchangeably herein. Relative terms such as left, right, forward, rearward, top, bottom, side, upper, lower, horizontal, vertical, and the like may be used herein and, if so, are from the perspective observed in the drawing. These terms are used only to simplify the description, however, and not to limit the scope of the invention in any way.

Reference throughout this specification to "one embodiment," "certain embodiments," "one or more embodiments" or "an embodiment" means that a feature, structure, material, or characteristic described about the embodiment is included in at least one embodiment of the invention. Thus, the appearances of the phrases such as "in one or more embodiments," "in certain embodiments," "in one embodiment" or "in an embodiment" in various places throughout this specification are not necessarily referring to the same embodiment of the invention. Where applicable, trade designations are set out in all uppercase letters.

Provided are methods and articles made therefrom for making electrically-conductive films, including electrically-conductive films with a surface structured in three dimensions and/or relieved in some areas. The provided films are made on a release layer and can have a topologically structured or masked surface. Exemplary methods for preparing these films are illustrated in the figures and described in detail below.

The electrically-conductive films described herein are made with the assistance of a release layer as part of a release assembly. The release assembly can have a major surface that is generally flat, or topologically structured. An exemplary release assembly having a topologically structured surface is shown in FIG. 1 in perspective view and hereinafter referred to by the numeral 100. A cross-sectional view of the release assembly 100 is schematically shown in FIG. 2.

Figure 2:
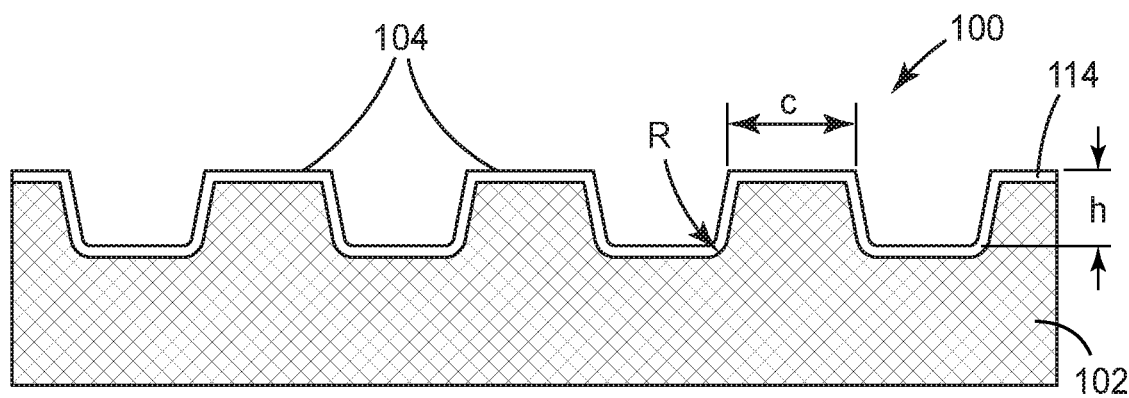
FIG. 2 is a cross-sectional side view of the release assembly of FIG. 1.

As shown in FIGS. 1 and 2, the release assembly 100 has a carrier layer 102 that is continuous, with a topologically structured surface comprised of a plurality of topological features 104 extending outward (protrusions) or inward (depressions) from the surface of the carrier layer 102. In this instance, the topological features 104 are proud from the surface and arranged in a rectilinear pattern, although this arrangement is exemplary and other patterns may be used. The carrier layer 102 and topological features 104 may or may not be part of an integral component.

The shape and spacing of the topological features 104 need not be restricted. In this embodiment, the topological features 104 are protruding rectangular frusta, each having a height h and width w, and being separated from each other by a distance d. Pitch p is equal to width w plus distance d between topological features. The pitch p of the topological features 104 may be any suitable pitch and is typically from 10 micrometers to 50 mm, from 50 micrometers to 10 mm, from 200 micrometers to 3 mm, or in some embodiments, less than, equal to, or greater than 10 micrometers, 12, 15, 17, 20, 25, 30, 35, 40, 45, 50, 60, 70, 80, 90, 100, 110, 120, 150, 200, 300, 400, 500, 750 micrometers, 1 mm, 2, 5, 10, 20, 30, 40, or 50 mm.

The height h can be from 0.1 micrometers to 400 micrometers, from 1 micrometers to 200 micrometers, from 6 micrometers to 80 micrometers, or in some embodiments, less than, equal to, or greater than 0.01 micrometers, 0.1, 1, 6, 20, 50, 80, 100, 200 or 400 micrometers.

The width w can be from 1 micrometer to 50 mm, from 10 micrometers to 10 mm, from 100 micrometers to 3 mm, or in some embodiments, less than, equal to, or greater than 1 micrometer, 2, 3, 4, 5, 10, 15, 20, 25, 30, 35, 40, 45, 50, 60, 70, 80, 90, 100, 150, 200, 300, 400, 500, 750 micrometers, 1 mm, 2, 5, 7, 10, 15, 20, 25, 30, 35, 40, 45, or 55 mm.

The distance d can be from 0 micrometer to 50 mm, from 0 micrometers to 10 mm, from 0 micrometers to 3 mm, or in some embodiments, less than, equal to, or greater than 0 micrometers, 1, 2, 3, 4, 5, 7, 10, 15, 20, 25, 30, 35, 40, 45, 50, 60, 70, 80, 90, 100, 150, 200, 250, 300, 350, 400, 450, 500, 750 micrometers, 1 mm, 2, 5, 7, 10, 20, 30, 40, or 55 mm.

The topological features may be proud extending outward from the surface or it may be shy extending inward from the surface. Useful topological features include cones, hemispheres, humps, divots, or frusta thereof. In other embodiments, the topological features may be pyramids of three, four, or more sides, or frusta thereof. In other embodiments, the topological features may be dimpled frusta or any of the foregoing, e.g., bisected torus shapes. The distribution of topological features 104 may be ordered, repetitive, random, or combinations thereof.

The release layer 114 has an exposed major surface, or release surface, which may display the topological features or may be flat. The release layer can contain one or more of a metal, a fatty acid surfactant, a polymer, or a metal oxide. In one embodiment, the release layer 114 is made from a polymer, thus providing a topologically structured surface that is polymeric. Suitable polymers include polyolefins such as polyethylene, polypropylene, and blends and copolymers thereof. The release layer 114 could also be composed of a metal such as nickel.

The plurality of topological features 104 on the carrier layer 102 can be provided using any known method. Useful methods include molding or embossing a flat film. For example, a polymeric film or extrudate can be placed in contact with a mold under heat and pressure to form the topological features 104. Alternatively, the topological features 104 may be made using a subtractive manufacturing process such as milling, or directly fabricated using an additive manufacturing process such as 3D printing.

In some embodiments, the release layer 114 is derived from a formable layer, such as a metal foil. Metal foils suitable for this purpose include those of malleable metals, such as copper. The formable layer can be embossed against a topologically structured substrate. For instance, the plurality of topological features 104 can be formed by pressing the foil against a tool having an inverse shape to the plurality of topological features 104.

The formable layer can have an average thickness of from 0.1 millimeters to 2 micrometers, from 0.1 millimeters to 0.4 micrometers, from 0.05 millimeters to 6 micrometers, or in some embodiments, less than, equal to, or greater than 0.1 micrometers, 1, 5, 10, or 20, 100, 500, 1000, or 2000 micrometers.

It is to be understood that the release assembly 100 need not have a monolithic construction. For example, release layers can be made from multilayered constructions as shown in FIGS. 3-6.

Figure 3:
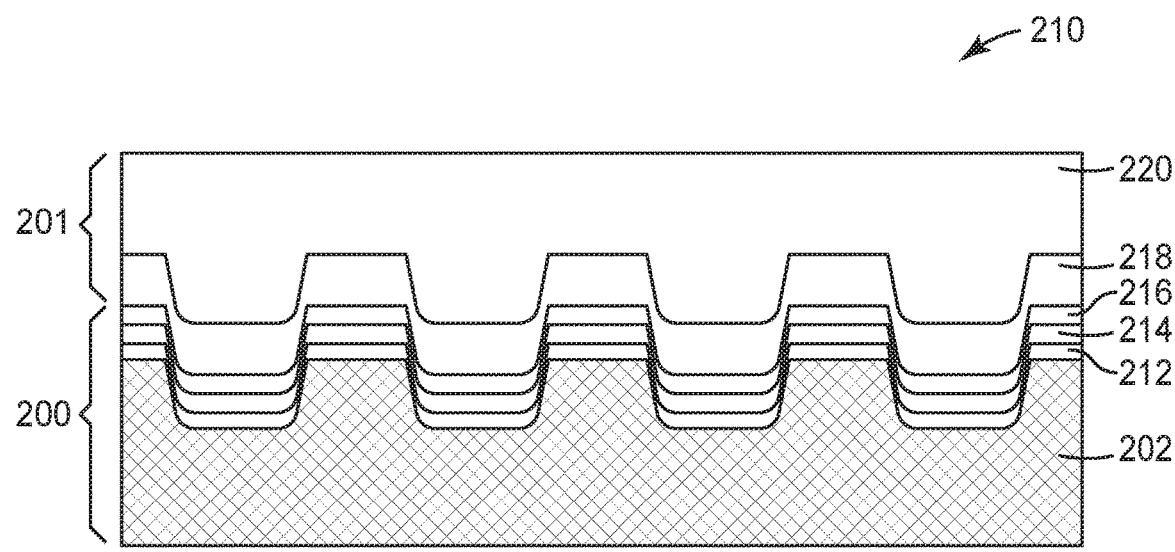
FIG. 3 is a cross-sectional side view of a conductor assembly disposed on a release assembly according to another embodiment.

FIG. 3 shows a multilayered assembly 210 that includes a release assembly 200 and a conductor assembly 201 disposed on the release assembly 200. The release assembly 200 itself has a multilayered construction and includes, in the following order, a carrier layer 202, conductive seed layer 214, and release layer 216. Optionally and as shown, a tie layer 212 is disposed between the carrier layer 202 and the conductive seed layer 214 to improve the bond between them. In the figures, the thicknesses of these layers have been exaggerated for clarity—it is to be understood that the actual layer cross-sections would appear more uniform in thickness than in FIGS. 3-6. Aspects of these layers will be described further below.

The carrier layer 202 is a layer that is topologically structured with the same pattern as the release assembly 100 in FIG. 1. Any of the above methods of making carrier layer 102 could also be used to make the carrier layer 202. In a preferred embodiment, the carrier layer 202 is made from polypropylene and formed by a molding process. Optionally, the surface of the carrier layer 202 is pre-treated by functionalizing the surface of the carrier layer 202 with an oxygen or nitrogen plasma. Plasma treatment can improve interfacial compatibility between metal and polymer layers, adhesion strength, and environmental stability.

The tie layer 212 is made from an element that offers a strong interfacial bond strength between the carrier layer 202 and subsequent deposited metal layers. The conductive seed layer 214 provides a surface having sufficient electrical conductivity to enable the eventual electroplating of an electrically-conductive layer 218, as shown in FIG. 3.

In an exemplary embodiment, the tie layer 212, conductive seed layer 214, and release layer 216 are layers deposited onto the carrier layer 202 using a vacuum deposition process. In some embodiments, this is a physical vapor deposition process. Physical vapor deposition processes include cathodic arc deposition, electron beam physical vapor deposition, evaporative deposition, pulsed laser deposition, sputter deposition, and pulsed electron deposition.

In some embodiments, and as shown in the Examples, each of the tie layer 212, conductive seed layer 214, and release layer 216 can be sequentially deposited by sputter deposition. Sputter deposition is a process in which a solid target material is bombarded with high energy particles to eject particles from the target material onto a substrate. In one embodiment, the tie layer 212 is comprised of chromium, the conductive seed layer 214 is comprised of copper, and the release layer 216 is comprised of oxidized nickel.

Exemplary materials for the conductive seed layer 214 include copper, aluminum, nickel, zinc, silver, gold, titanium, chromium, platinum, beryllium, magnesium, iron, palladium, hafnium, indium, lanthanum, molybdenum, neodymium, silicon, germanium, strontium, tantalum, tin, titanium, tungsten, vanadium, yttrium, zirconium and the like, as well as combinations thereof disposed as alloys and/or blends and/or layers.

Sputter processing conditions can be appropriately selected to provide thin uniform films that replicate the shape of the carrier layer 202, as shown in FIG. 3.

In some embodiments, the tie layer 212, conductive seed layer 214 are metal layers, while the release layer 216 is a metal oxide layer. For example, the tie layer 212 can be comprised of chromium or a nickel-chromium alloy, the conductive seed layer 214 can be comprised of copper, and the release layer 216 can be comprised of a copper oxide, each layer being obtained by sputter deposition.

In alternative embodiments, the tie layer 212 and conductive seed layer 214 are metal layers, while the release layer 216 is neither a metal nor a metal oxide. For example, the tie layer 212 can be a chromium layer, the conductive seed layer 214 can be a copper layer, and the release layer 216 can be a polymer release layer.

Exemplary organic compounds for the polymer release layer may be selected from esters, vinyl compounds, alcohols, carboxylic acids, acid anhydrides, acyl halides, thiols, amines and mixtures thereof. These organic compounds can be deposited together to form a mixed layer or they can be deposited separately. In applications where compounds are immiscible, it may be desirable to mix these materials in the vapor phase after separate evaporation.

Referring again to FIG. 3, the conductor assembly 201 is disposed on the release assembly 200. The conductor assembly 201, as shown, includes an electrically-conductive layer 218 and an optional base layer 220 disposed on the electrically-conductive layer 218. Details concerning each of these layers are below.

The electrically-conductive layer 218 can be directly deposited onto the release layer 216 of the release assembly 200. To carry sufficient electrical current in the event of a lightning strike, the electrically-conductive layer 218 can be made considerably thicker than the tie layer 212, conductive seed layer 214, and release layer 216. The electrically-conductive layer 218 can be deposited by electrolytic plating. Preferably, the electrically-conductive layer 218 has an outer surface that substantially replicates the topologically structured surface (e.g., the topological features) of the carrier layer 202 beneath.

The electrically-conductive layer 218 is made from an electrical conductor, generally a metal. Preferred metals for the electrically-conductive layer 218 have a favorable balance of properties including high electrical conductivity, low density and high resistance to corrosion. Exemplary metals can include, without limitation, copper, aluminum, nickel, zinc, silver, gold, titanium, chromium, platinum, beryllium, magnesium, iron, palladium, hafnium, indium, lanthanum, molybdenum, neodymium, silicon, germanium, strontium, tantalum, tin, niobium, tungsten, vanadium, yttrium, and zirconium, as well as combinations thereof disposed as alloys and/or blends and/or layers.

The electrically-conductive layer 218 is substantially continuous to allow an electrical current to be conveyed long distances along the plane of the conductor assembly 201.

The electrically-conductive layer 218 can have any suitable thickness. Higher thicknesses reduce electrical resistance, but also increases weight, so intermediate thicknesses are often desirable. The average thickness of the electrically-conductive layer 218 can be from 0.001 micrometers to 100 micrometers, from 0.01 micrometers to 50 micrometers, from 0.1 micrometers to 20 micrometers, or in some embodiments, less than, equal to, or greater than 0.001 micrometers, 0.005, 0.01, 0.05, 0.1, 0.2, 0.5, 1, 2, 5, 10, 20, 50, 70, or 100 micrometers.

The base layer 220 in this embodiment is a layer exposed at the top major surface of the conductor assembly 201. The base layer 220 adheres to the electrically-conductive layer 218 and provides added strength and enables the conductor assembly 201 to be easily handled without deforming or tearing.

In some embodiments, the base layer 220 is comprised of a thermoplastic material or a curable thermoset composition that has been at least partially cured prior to peeling the electrically-conductive layer from the release layer. The inclusion of a suitable curative in the curable thermoset composition can enable the composition to be crosslinked upon, for example, heating or irradiation with actinic radiation (e.g., visible or ultraviolet light).

Examples of suitable thermoset and thermoplastic compositions include epoxies, epoxy curing agents, phenolics, phenols, cyanate esters, polyimides (e.g., bismaleimide and polyetherimides), polyesters, benzoxazines, polybenzoxazines, polybenzoxazones, polybenzimidazoles, polybenzothiazoles, polyamides, polyamidimides, polysulfones, polyether sulfones, polycarbonates, polyethylene terephthalates, cyanates, cyanate esters; and polyether ketones (e.g., polyether ketone, polyether ether ketone, polyether ketone and the like), combinations thereof, and precursors thereof.

Curatives broadly include initiators, catalysts, crosslinkers, and combinations thereof. In some embodiments, the curative includes an anhydride, an amine curing agent, an amide curing agent, a polycarboxylic acid, a polyphenol, or a combination thereof. In some embodiments, the curative includes a substituted or unsubstituted phthalic anhydride, a hydrogenated derivative of a substituted or unsubstituted phthalic anhydride, a dicyandiamide, a diaminodiphenylsulfone, or a combination thereof.

In some embodiments, the base layer 220 is comprised of a fluoropolymer, such as a fluoroelastomer. Fluoroelastomers can be cured from precursor compositions that are comprised of interpolymerized monomer units, where the monomer units comprise at least one of perfluorinated olefins, nonfluorinated olefins, chlorotrifluoroethylene, tetrafluoroethylene, vinylidene fluoride, hexafluoropropylene, ethylene, propylene, perfluorinated alkyl vinyl ethers, perfluorinated allyl ethers, vinyl fluoride, and trifluoroethylene and combinations thereof.

In some embodiments, the base layer 220 is comprised of a polysulfide, polythioether, or copolymer thereof. The layer can be a curable polymer that is cured by mixing the components with each other and curing in situ. The composition may include a first component that is a polysulfide, a polythioether, a copolymer thereof, or a combination thereof. A second component can include one or more glycol di((C1-C20) hydrocarbyl) carboxylate esters, wherein at each occurrence the (C1-C20)hydrocarbyl is independently substituted or unsubstituted. The second component can also include an oxidizing agent. Any material described herein as being part of the first component can alternatively be employed in part or in whole in the second component or in another component of the layer, and likewise any material described herein as being part of the second component can alternatively be employed in part or in whole in the first component or in another component of the layer. The weight ratio of the first component to the second component can be any suitable ratio, such as 2:1 to 14:1, or 9:1 to 11:1, or 2:1 or less, or less than, equal to, or greater than 3:1, 4:1, 5:1, 6:1, 7:1, 8:1, 9:1, 9.5:1, 10:1, 10.5:1, 11:1, 12:1, 13:1, or 14:1 or more. The first component can be any suitable proportion of the layer. The first component can be 80 wt % to 95 wt % of the adhesive, 90 wt % to 93 wt %, 80 wt % or less, or less than, equal to, or greater than 81 wt %, 82, 83, 84, 85, 86, 87, 88, 89, 90, 90.5, 91, 91.5, 92, 92.5, 93, 94 wt %, or 95 wt % or more. The second component can be any suitable proportion of the adhesive, such as 5 wt % to 20 wt % of the adhesive, or 7 wt % to 10 wt % of the adhesive, or 5 wt % or less, or less than, equal to, or greater than 6 wt %, 7, 8, 9, 10, 11, 12, 14, 16, 18, or 20 wt % or more.

One-part compositions are also possible, in which the polysulfide, polythioether, or copolymer thereof is cured by actinic radiation. For example, a polythioether polymer network can be obtained by radiation curing a composition that includes: a) at least one dithiol monomer; b) at least one diene monomer; c) at least one multifunctional monomer 30 having at least three ethenyl groups; and d) at least one photoinitiator. As another example, a polythioether polymer network can be radiation-cured from a dual-cure composition including: a) a dithiol monomer; b) a diene monomer; c) a radical cleaved photoinitiator; d) a peroxide; and e) an amine; where the peroxide and amine together are a peroxide-amine redox initiator. Further details concerning radiation-cured polysulfides, polythioethers, and copolymers thereof are described in U.S. Pat. No. 9,650,150 (Zook et al.), U.S. Patent 5 Publication No. 2016/0032058 (Ye et al.) and International Patent Publication No. WO 2016/106352 (Ye et al).

Examples of polysulfides, polythioethers, and copolymers thereof include polymers including repeating units that include a sulfide (e.g., —S—S—) or a thioether (e.g., -thio(C1-05)alkylene)-) moiety therein, and including pendant or terminal mercaptan (i.e., −10 SH) groups. Examples of polysulfides can include polymers formed by condensing bis(2-chloroethoxy)methane with sodium disulfide or sodium polysulfide. Examples of polythioethers include polymers formed via condensation reaction of, for example, 2-hydroxyalkyl sulfide monomers such as those described in U.S. Pat. No. 4,366,307 (Singh et al.) and those formed via addition reactions of dithiols and divinylethers such as those described in U.S. Pat. No. 6,486,297 (Zook et al). The polysulfide, polythioether, or copolymer thereof can have any suitable molecular weight, such as a number-average molecular weight of 500 g/mol to 5,000 g/mol, or 500 g/mol to 1,500 g/mol, or 500 g/mol or less, or less than, equal to, or greater than 600 g/mol, 700, 800, 900, 1,000, 1,100, 1,200, 1,300, 1,400, 1,500, 1,600, 1,800, 2,000, 2,250, 2,500, 2,750, 3,000, 3,500, 4,000, 4,500, or 5,000 g/mol or more. The polysulfide, polythioether, copolymer thereof, or mixture thereof can have any suitable mercaptan content based on the overall weight of the liquid polysulfide, such as 0.1 wt % to 20 wt %, 1 wt % to 10 wt %, 1 wt % to 6 wt %, or 1 wt % to 3 wt %, or 0.1 wt % or less, or less than, equal to, or greater than 0.5 wt %, 1, 3, 4, 5, 6, 7, 8, 9, 10, 12, 14, 16, 18, 25 or 20 wt % or more. The polysulfide, polythioether, or copolymer thereof, or mixture thereof can form any suitable proportion of the first component, such as 40 wt % to 100 wt % of the first component, 50 wt % to 80 wt %, or 40 wt % or less, or less than, equal to, or greater than 45 wt %, 50, 55, 60, 65, 70, 75, 80, 85, 86, 88, 90, 91, 92, 93, 94, 95, 96, 97, 98, 99, 99.9 wt %, 30 or 99.99 wt % or more. The polysulfide, polythioether, copolymer thereof, or mixture thereof can form any suitable proportion of the layer, such as 30 wt % to 95 wt % of the adhesive, or 40 wt % to 70 wt %, or 40 wt % or less, or less than, equal to, or greater than 45 wt %, 50, 55, 60, 65, 70, 72, 74, 76, 78, 80, 81, 82, 83, 84, 85, 86, 87, 88, 89, 90, 91, 92, 93, 94, or 95 wt % or more.

In a preferred embodiment, the curable thermoset composition is a two-part curable epoxy composition.

The curable thermoset resins may contain one or more heterogenous fillers. The type of filler used is not particularly restricted and may, for example, take the form of spheres, flakes, rods, filaments (e.g. fibers), or non-specific shapes. Useful fillers include, but are not limited to, silica particles, glass particles, ceramic particles, carbon nanotubes, and combinations thereof.

The heterogeneous filler can be present in any suitable amount to provide a given viscosity, strength, durability, handling, and/or conductivity profile. In non-limiting embodiments, the filler is present in an amount of from 8 percent to 55 percent, from 13 percent to 50 percent, from 18 percent to 40 percent, or in some embodiments, less than, equal to, or greater than 8 percent, 10, 13, 18, 23, 27, 30, 35, 40, 45, 50, 51, 53, or 55 percent, based on the overall weight of the composition.

Use of the base layer is optional to stabilize the conductor or impart performance characteristics. The base layer 220 is preferably thin to avoid adding more weight than needed, while sufficiently thick to provide strength and integrity to the electrically-conductive layer 218. The base layer 220 typically has an overall thickness of less than 1 millimeters, less than 100 micrometers, less than 50 micrometers, less than 10 micrometers, less than 5 micrometers, less than 2 micrometers, or less than 1 micrometer. The minimum thickness of the base layer 220 can be at least 0.001 micrometer, at least 0.01 micrometer, or at least 0.1 micrometer.

The conductor assembly 201 can include more than one base layer. For example, the conductor assembly 201 may further include a second base layer disposed on the first base layer, where both the first and second base layers are comprised of curable epoxy resins, or where both the first and second base layers are comprised of differing suitable resins.

Figure 4:
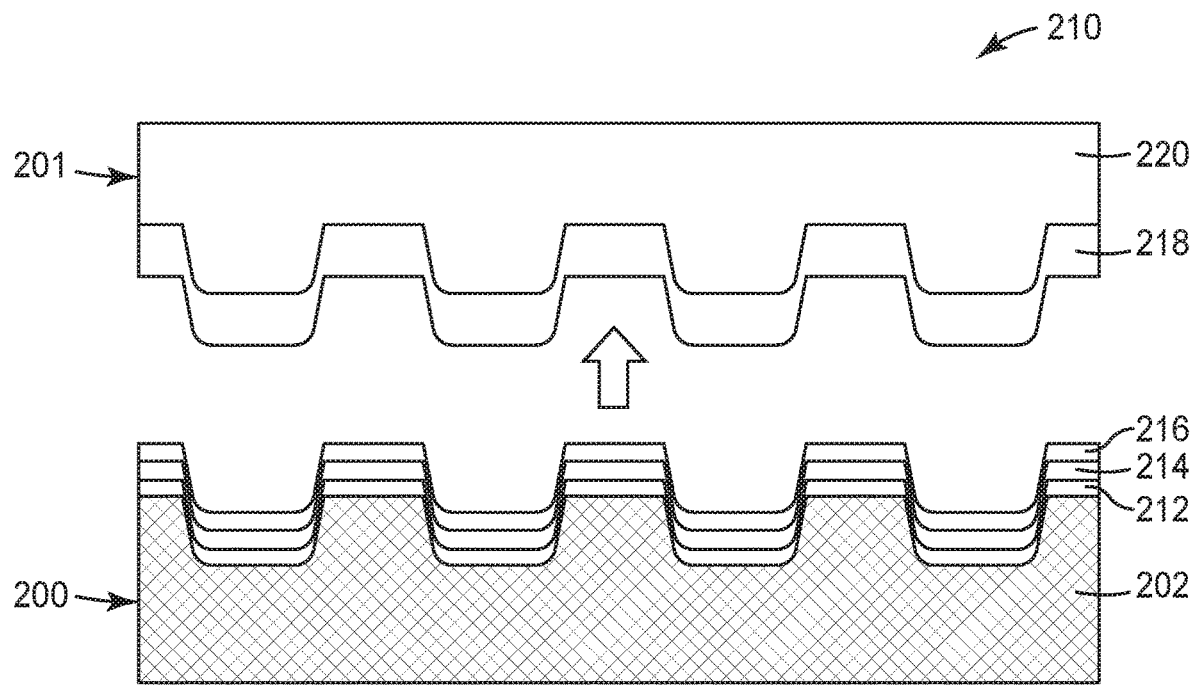
FIG. 4 is a cross-sectional side view of the conductor assembly being removed from the release assembly of FIG. 3.

FIG. 4 shows the step of separating the conductor assembly 201 from the release assembly 200. In a preferred embodiment, the conductor assembly 201 is peeled away from the release assembly 200, such that the base layer 220 and the electrically-conductive layer 218 are collectively separate from the release layer 216 to provide a stand-alone conductive film. Advantageously, the interface between the electrically-conductive layer 218 and the release layer 216 is weak, allowing for a clean separation between the two layers. In some embodiments, the interfacial bond between the electrically-conductive layer 218 and the release layer 216 is sufficiently weak that only a relatively small peel force is required.

After separating the conductor assembly 201 from the release assembly 200. The conductor assembly 201 can be especially suitable when incorporated into lightning strike protection applications, such as in lightning strike protection films. When used in lightning strike applications, an optional adhesive layer may be disposed on either face of the conductor assembly 201 for attachment to non-conductive substrates of semi-conductive substrates susceptible to damage from lightning strikes.

Adhesive layers can be comprised of any of the compositions described for the base layer, including curable thermosets, thermoplastics, polysulfides, polythioethers, and fluoroelastomers, as well as acrylic, silicone, and urethane pressure sensitive adhesives. Suitable pressure-sensitive adhesives and methods for their preparation are disclosed in U.S. Pat. No. 6,475,616 (Dietz et al).

Optionally, the provided lightning strike protection films can further include a thermoplastic protective layer disposed on the electrically-conductive layer to prevent damage to the electrically-conductive layer as a result of weathering or erosion during use.

As a further option, a composite part of an aircraft or wind turbine can be provided with a lightning strike protection film having a curable adhesive layer at various stages of part manufacture. For example, the adhesive layer can be used to affix the lightning strike protection film at or near the exterior face of the part by curing the adhesive layer to the part during or after fabrication of the part.

Non-conductive or semi-conductive substrates include, for example, fiber-reinforced composites, which may be used in aircraft structures, marine structures, or stationary structures, such as wind turbines.

Figure 5:
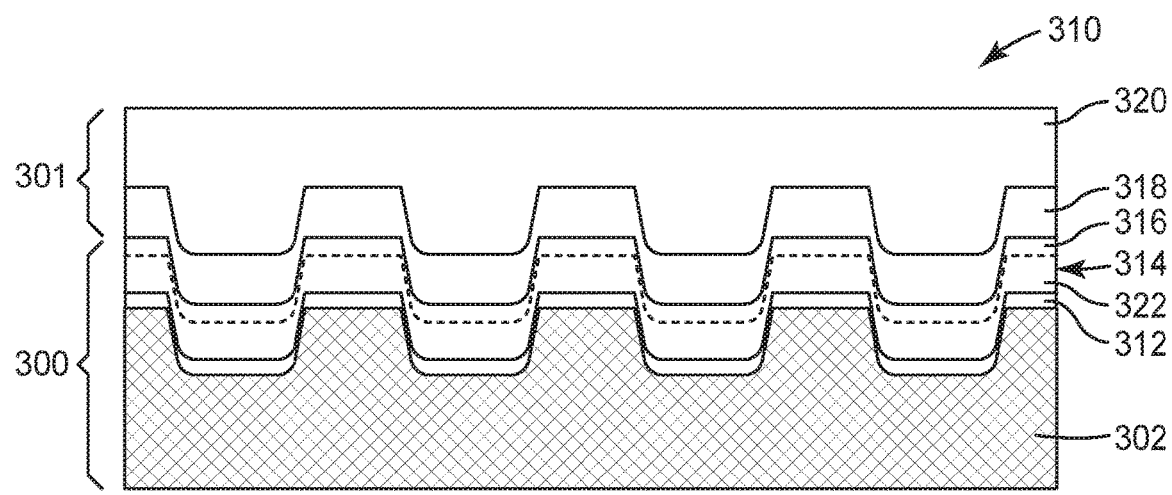
FIGS. 5 and 6 are cross-sectional side views of conductor assemblies disposed on respective release assemblies according to various other embodiments.

FIG. 5 shows a multilayered assembly 310 according to another embodiment in which the release layer is formed in situ. The multilayered assembly 310 is comprised of a conductor assembly 301 disposed on a release assembly 300.

The release assembly 300 includes a carrier layer 302, tie layer 312, and conductive seed layer 314, whose characteristics are generally analogous to respective carrier layer 202, tie layer 212, and conductive seed layer 214, as previously described. In this embodiment, however, the conductive seed layer 314 is made from an oxidizable metal from which a top portion thereof is oxidized to form an in-situ release layer 316 disposed on a non-oxidized portion 322. In the schematic of FIG. 5, the release layer 316 and non-oxidized portion 322 are depicted as sublayers of the original conductive seed layer 314 and separated from each other by a dotted line.

In one embodiment, the tie layer 312 is a chromium or nickel-chromium alloy, the conductive seed layer 314 is copper, and the in-situ release layer 316 is copper oxide. The in-situ release layer 316 can be obtained using any of many suitable methods. For example, an oxygen plasma generator can be used to oxidize a top portion of the conductive seed layer 314. The conductive seed layer 314 can also be oxidized by chemical means by immersing the copper metal in an aqueous solution of hydrogen peroxide and phosphoric acid to convert the copper to copper oxide.

In this process, phosphoric acid can be added to the aqueous solution of hydrogen peroxide to act as a non-organic wetting agent that helps the peroxide solution effectively penetrate cavities along the topologically structured surface. Because phosphoric acid is itself an oxidizing agent, and does not adversely affect the oxidization of the copper induced by the hydrogen peroxide.

Advantageously, the thin copper oxide layer has a low band-gap energy and is relatively chemically inert compared with copper metal. As a result, the oxidized copper surface can provide sufficient electron charge transfer to support electroplating of electrically-conductive layers, while significantly limiting the metallic bond interaction between the oxidized copper and newly deposited metal atoms. This creates a weakly bound interface whereby a metal layer electroplated onto the oxidized copper surface may be cleanly and easily detached from the oxidized copper surface by peeling one layer away from the other.

Disposed on the release layer 316 is an electrically-conductive layer 318 and an optional base layer 320. The electrically-conductive layer 318 is analogous to the electrically-conductive layer 218 and thus its characteristics, options, and advantages need not be repeated here.

Uses of bronze alloys and alternating layers of copper and tin have been associated with enhanced corrosion resistance (see, e.g., Robbiola et al., "Morphology and Mechanisms of Formation of Natural Patinas on Archaeological Cu—Sn Alloys" *Corrosion Science,* 40(12) (1998), 2083-2111; Tu, "Interdiffusion and Reaction in Bimetallic Cu—Sn Thin Films" *Acta Metallurgica,* 21 (1973), 347-354). Regarding the provided electrically-conductive films, corrosion testing by cyclic voltammetry and electrical impedance spectroscopy has shown improved corrosion resistance of copper-tin layered films, in comparison to pure copper films, in 0.1 M NaCl immersion testing.

The base layer 320 is analogous to the base layer 220 in FIGS. 3-4 and can be made from any material suitable for base layer 220, such as a cured epoxy resin layer.

As with the conductor assembly 201, the conductor assembly 301 can be cleanly removed from the release assembly 300 by peeling the former assembly from the latter assembly. Other aspects of the multilayered assembly 310 are like those described with respect to multilayered assembly 210 and shall not be repeated.

Figure 6:
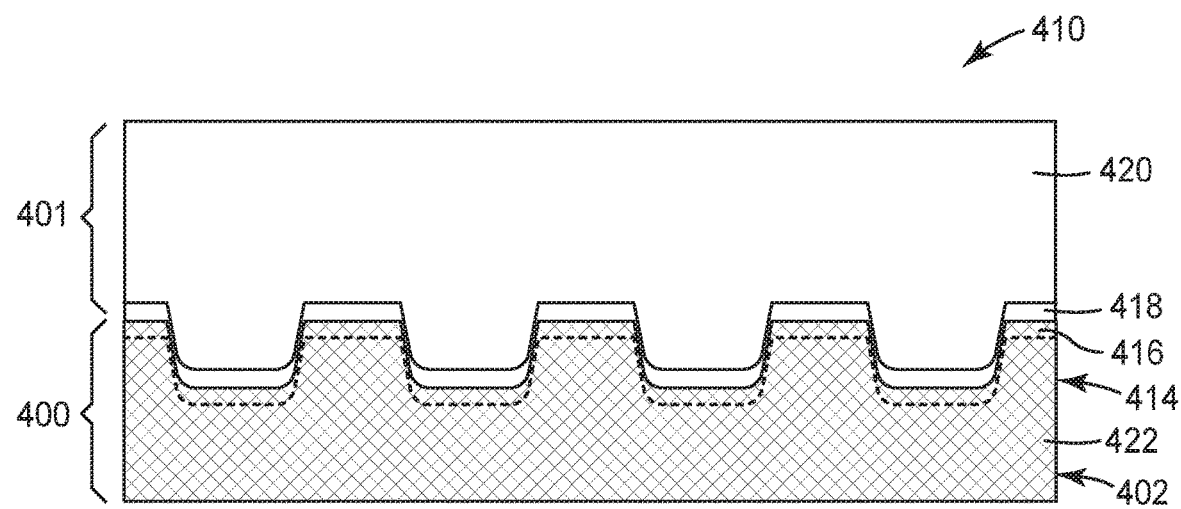

FIG. 6 shows a multilayered assembly 410 that includes a conductor assembly 401 and release assembly 400, where a release layer is obtained by oxidizing an outer surface of conductive layer directly. In this embodiment, the release assembly 400 includes a conductive layer 402 that is made from a material, such as copper, which is capable of being oxidized to form a release layer, such as copper oxide.

Any of the oxidation methods above can act upon the conductive layer 402 to provide a discrete release layer 416 adjacent to a non-oxidized portion 422 of the conductive layer 402. Electrically-conductive layer 418 and base layer 420 can then be subsequently deposited, and cleanly removed, as previously described. Preparation of this construction can be simpler than that of the prior multilayer assembly 310 because there is no need to deposit a seed layer.

Figure 7:
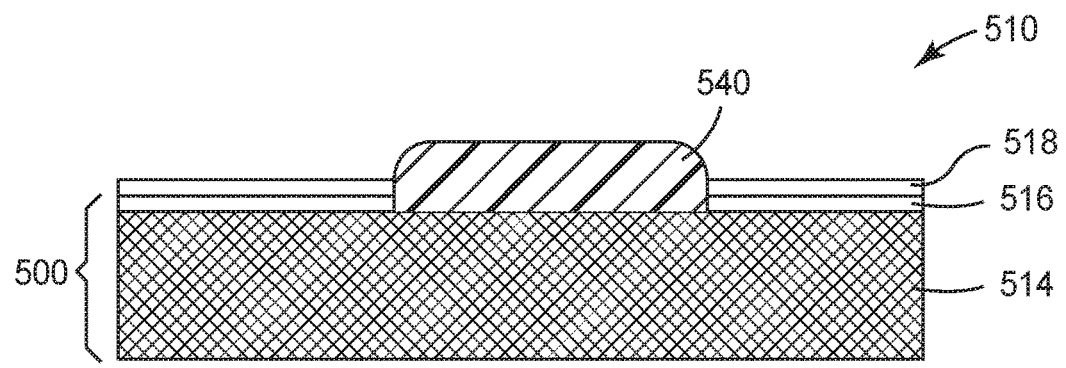
FIG. 7 is a plan view of a patterned masking layer disposed on a release layer.

FIG. 7 shows a multilayered assembly 510 comprised of a release assembly 500 and an electrically-conductive layer 518 disposed thereon. The release assembly 500 includes a conductive layer 514, such as described regarding FIGS. 1-6, that is continuous and non-perforated. The conductive layer 514 is selectively covered with a masking layer 540, the latter is disposed in a pattern of discrete dots, with a single dot being shown in FIG. 7. The masking layer 540 may be disposed in any given coating pattern. Such pattern can be continuous or discontinuous, and pattern elements can be of any suitable shape or arrangement. The masking layer 540 is preferably of sufficient thickness to prevent plating locally.

The masking layer 540 can be selectively coated onto the conductive layer 514 such that only selected portions of the major exposed surface of the conductive layer 514 are in contact with the masking layer 540. The selected portions can represent less than, equal to, or greater than, 10%, 20, 30, 40, 50, 60, 70, 80, 90, or 95% of the total area of the major exposed area of the conductive layer 514.

The process of coating the masking layer 540 may occur by any known method, such as bar coating, roll coating, knife coating, curtain coating, gravure coating, spraying, dipping, screen coating, kiss coating, flexo printing, offset printing, photolithography, nano-imprint lithography, powder bed fusion, binder jetting, lamination, extrusion, directed energy deposition, ink jet printing, or additive manufacturing.

Further, the masking layer 540 can be made from any known material that will insulate the conductive layer 514 from the plating action so long as the material can withstand the fluids used in the plating process. Such materials can include any of the resins described above for use in the base layer 220 or inks, paints or other coatings.

The release assembly 500 includes a release layer 516 disposed on the conductive layer 514 to facilitate separation of the electrically-conductive layer 518. The release layer 516 can be made of any of the materials useful for the release layer 216 and may be disposed onto the conductive layer 514 in the same manner the release layer 216 can be disposed onto conductive seed layer 214.

In another embodiment, the release layer 516 may be made from any of the same materials as release layer 316 and the conductive layer 514 can be made from any of the same materials as conductive layer 314. The release layer 516 can be oxidized from conductive layer 514 in the same manner as release layer 316 is oxidized from conductive layer 314. The release layer 516 may be disposed onto the conductive layer 514 or oxidized from conductive layer 514 before or after the masking layer 540 is applied.

Figure 8:
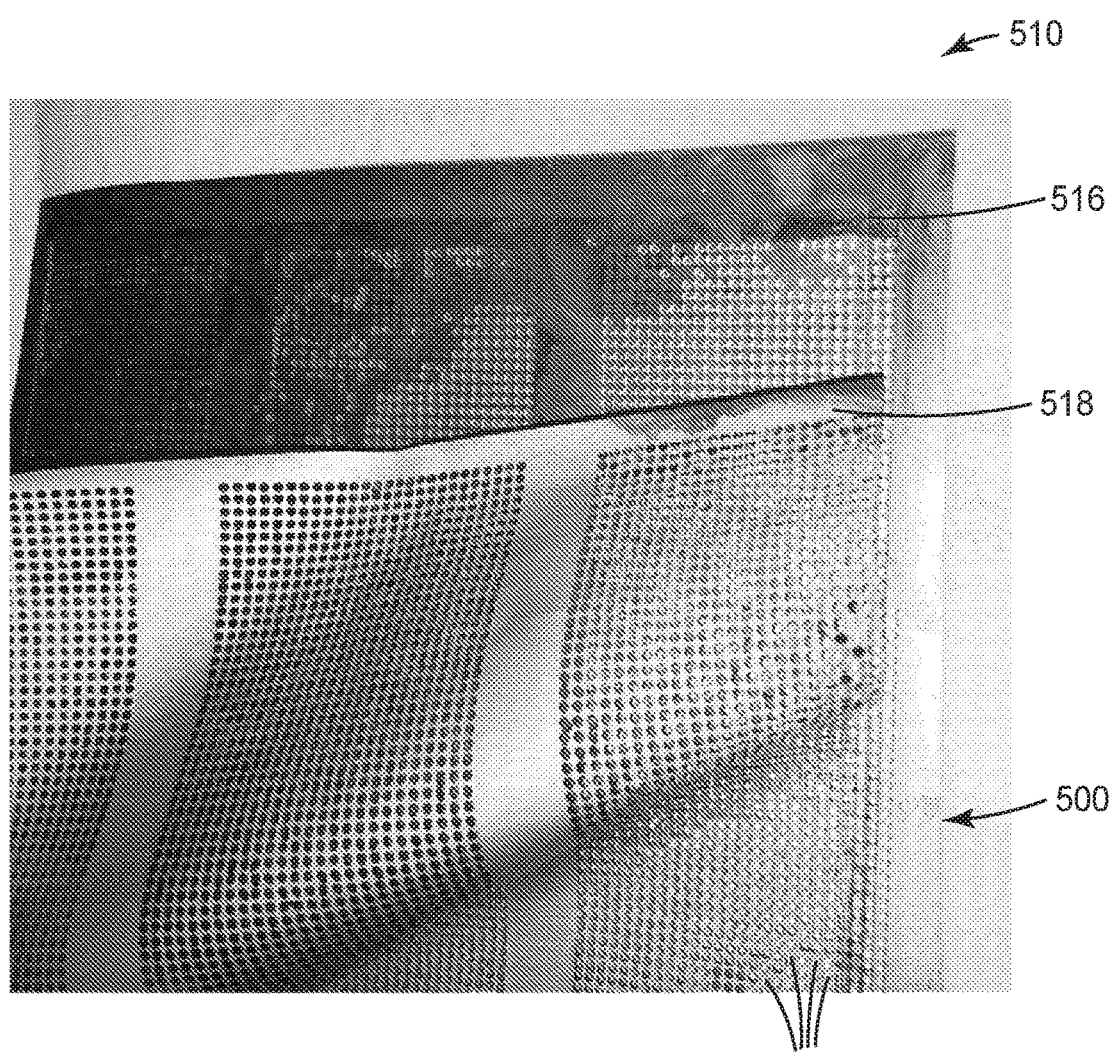
FIG. 8 is a plan view of a conductive film peeled away from the masking layer and release layer.

FIG. 8 shows the step of separating the electrically-conductive layer 518 from the release assembly 500 using a peeling motion, without use of an optional base layer. This can be achieved by depositing at least one electrically-conductive layer 518 onto the release layer 516 according to any of the methods previously described. Likewise, the electrically-conductive layer 518 may be comprised of the same materials as the electrically-conductive layers 218, 318, 418 previously described.

The masking layer 540 is not electrically-conductive and thus does not participate in the electroplating process, resulting in the electrically-conductive layer being selectively deposited on portions not covered by the masking layer 540. When the electrically-conductive layer 518 is separated from the conductive layer 514, the masking layer 540 remains behind on the release layer 516, thereby producing the patterned conductive film shown. As a further advantage, it is possible for the release layer 516 and underlying layers to be re-used.

The precise thickness of the masking layer 540 in FIGS. 7 and 8 is not critical. To preserve the shape of the pattern elements in the end product, however, it can be preferable for the masking layer 540 to be thicker than that of the electrically-conductive layer 518 so that the electrically-conductive layer 518 does not extend over the masking layer 540 during electroplating. The masking layer 540 can have an average thickness of 0.01 micrometers to 700 micrometers, 0.5 micrometers to 400 micrometers, 1 micrometer to 200 micrometers, or in some embodiments, less than, equal to, or greater than 0.01 micrometers, 0.5, 1, 2, 5, 10, 20, 50, 100, 150, 200, 300, 400, 500, 600, or 700 micrometers.

Electrically-conductive layers made using the methods described with respect to FIGS. 5-8 can be incorporated into lightning strike protection films and applied to composite substrates in the manners previously described.

Further methods and articles, not intended to be exhaustive, are enumerated in the exemplary list of embodiments below:

1. A method of making an electrically-conductive film, the method comprising: providing a release layer with a release surface, the release surface optionally being a topologically structured surface; depositing at least one electrically-conductive layer on the release layer whereby the at least one electrically-conductive layer has an outer surface that substantially replicates the release surface; and peeling the at least one electrically-conductive layer away from the release layer to obtain the electrically-conductive film.
2. The method of embodiment 1, further comprising depositing a base layer on the at least one electrically-conductive layer, wherein the base layer and the at least one electrically-conductive layer are peeled away from the release layer collectively.
3. The method of embodiment 2, wherein the base layer is a thermoplastic layer.
4. The method of embodiment 3, wherein the thermoplastic layer is comprised of a fluoropolymer.
5. The method of embodiment 2, wherein the base layer is a curable layer and wherein the curable layer is at least partially cured prior to peeling the base layer and the at least one electrically-conductive layer away from the release layer.
6. The method of embodiment 5, wherein the curable layer comprises a polysulfide, polythioether, or a copolymer when cured.
7. The method of embodiment 5, wherein the curable layer comprises a curable epoxy composition.
8. The method of embodiment 5, wherein the curable layer comprises a fluoroelastomer when cured.
9. The method of embodiments 2-8 wherein the base layer contains one or more heterogenous fillers.
10. The method of any one of embodiments 2-9, wherein the base layer has a thickness in the range of from 2 micrometers to 300 micrometers.
11. The method of embodiment 10, wherein the base layer has a thickness in the range of from 5 micrometers to 150 micrometers.
12. The method of embodiment 11, wherein the base layer has a thickness in the range of from 10 micrometers to 75 micrometers.
13. The method of any one of embodiments 1-12, wherein the topologically structured surface comprises a two-dimensional array of protrusions or depressions, the protrusions or depressions having an average pitch of from 200 micrometers to 3000 micrometers and an average height of from 6 micrometers to 80 micrometers.
14. The method of embodiment 1-13, wherein the release layer comprises one or more of: a metal, a fatty acid surfactant, a polymer release layer, and a metal oxide.
15. The method of embodiment 14, wherein the release layer comprises a fatty acid surfactant.
16. The method of embodiment 14 or 15, wherein providing a release layer with a topologically structured surface comprises depositing the release layer on a topologically structured substrate.
17. The method of embodiment 16, wherein depositing the release layer on the topologically structured substrate comprises vacuum depositing the release layer, or precursor thereof, on the topologically structured substrate.
18. The method of embodiment 17, wherein vacuum depositing the release layer, or precursor thereof, on the topologically structured substrate comprises: providing an electrically-conductive seed layer on the topologically structured substrate; and vapor depositing the release layer, or precursor thereof, on the electrically-conductive seed layer.
19. The method of embodiment 18, wherein the seed layer comprises copper.
20. The method of embodiment 18 or 19, wherein the release layer comprises a metal.
21. The method of embodiment 20, wherein the metal comprises nickel.
22. The method of embodiment 18, wherein the release layer comprises metal oxide and wherein vacuum depositing the release layer, or precursor thereof, on the topologically structured substrate comprises: vapor depositing an electrically-conductive seed layer on the topologically structured substrate; and oxidizing the seed layer deposited on the topologically structured substrate.
23. The method of embodiment 22, wherein the electrically-conductive seed layer comprises copper and the metal oxide comprises copper oxide.
24. The method of embodiment 22, wherein the electrically-conductive seed layer comprises nickel and the metal oxide comprises nickel oxide.
25. The method of embodiment 14, wherein the release layer comprises metal oxide, the topologically structured substrate comprises a metal, and wherein the metal oxide is obtained by oxidizing the surface of the topologically structured substrate.
26. The method of embodiment 25, wherein the metal comprises copper and the metal oxide comprises copper oxide.
27. The method of embodiment 14, wherein the release layer comprises metal oxide and providing the release layer with a topologically structured surface comprises embossing a formable layer against a topologically structured tool.
28. The method of embodiment 27, wherein the formable layer comprises copper and the metal oxide comprises copper oxide.
29. The method of embodiment 27 or 28, wherein the formable layer has a thickness of from 0.1 micrometers to 2000 micrometers.
30. The method of embodiment 29, wherein the formable layer has a thickness of from 0.4 micrometers to 1000 micrometers.
31. The method of embodiment 30, wherein the formable layer has a thickness of from 6 micrometers to 50 micrometers.
32. The method of any one of embodiments 1-31, wherein the at least one electrically-conductive layer comprises copper, aluminum, nickel, zinc, silver, gold, titanium, chromium, platinum, beryllium, magnesium, iron, palladium, hafnium, indium, lanthanum, molybdenum, neodymium, silicon, germanium, strontium, tantalum, tin, niobium, tungsten, vanadium, yttrium, or zirconium, or combinations thereof disposed as alloys and/or blends and/or layers.
33. The method of any one of embodiments 1-32, wherein depositing the at least one electrically-conductive layer comprises electroplating the at least one electrically-conductive layer.
34. The method of any one of embodiments 1-33, wherein the electrically-conductive layer has a thickness in the range of from 0.001 micrometers to 100 micrometers.
35. The method of embodiment 34, wherein the electrically-conductive layer has a thickness in the range of from 0.01 micrometers to 50 micrometers.
36. The method of embodiment 35, wherein the electrically-conductive layer has a thickness in the range of from 0.1 micrometers to 20 micrometers.
37. The method of embodiment 14, wherein the release layer is a polymer release layer having a polymeric surface.
38. The method of embodiment 37, wherein the polymeric surface comprises a polyester or polyolefin.
39. The method of embodiment 37 or 38, further comprising functionalizing the polymeric surface using oxygen plasma.
40. The method of embodiment 37 or 38, further comprising functionalizing the polymeric surface using nitrogen plasma.
41. A method of making an electrically-conductive film, the method comprising: providing a release layer having a major surface, wherein selected portions of the major surface are placed in contact with a masking layer; depositing at least one electrically-conductive layer on the release layer whereby the at least one electrically-conductive layer is selectively deposited on portions not covered by the masking layer; and peeling the at least one electrically-conductive layer away from the release layer to obtain the electrically-conductive film.
42. A method of making an electrically-conductive film, the method comprising: providing an electrically-conductive seed layer having a major surface, wherein selected portions of the major surface are placed in contact with a masking layer; depositing a release layer on that portion of the major surface not covered by the masking layer; depositing at least one electrically-conductive layer on the release layer whereby the at least one electrically-conductive layer is selectively deposited on portions not covered by the masking layer; and peeling the at least one electrically-conductive layer away from the release layer to obtain the electrically-conductive film.
43. The method of embodiment 41 or 42, wherein the masking layer comprises a curable resin.
44. The method of embodiment 41 or 42, wherein the masking layer comprises a thermoplastic resin.
45. The method of any one of embodiments 41-44, wherein the masking layer is selectively deposited on the major surface by at least one of bar coating, roll coating, knife coating, curtain coating, gravure coating, spraying, dipping, screen coating, kiss coating, flexo printing, offset printing, photolithography, nano-imprint lithography, powder bed fusion, binder jetting, lamination, extrusion, directed energy deposition, ink jet printing, or additive manufacturing.
46. The method of any one of embodiments 41-45, wherein the masking layer has a thickness of from 0.01 micrometers to 700 micrometers.
47. The method of embodiment 38, wherein the masking layer has a thickness of from 0.5 micrometers to 400 micrometers.
48. The method of embodiment 39, wherein the masking layer has a thickness of from 1 micrometer to 200 micrometers.
49. The method of any one of embodiments 41-48, further comprising depositing a base layer on the at least one electrically-conductive layer, wherein the base layer and the at least one electrically-conductive layer are peeled away from the release layer collectively.
50. The method of embodiment 49, wherein the base layer has any of the optional characteristics of the base layer of embodiment 2.
51. The method of any one of embodiments 41-50, wherein the pattern of the masking layer comprises a two-dimensional array of shapes having an average pitch of from 0.5 millimeters to 20 millimeters.
52. The method of any one of embodiments 41-51, wherein the release layer has any of the optional characteristics of the release layer of embodiment 1.
53. An electrically-conductive film obtained using the method of any one of embodiments 1-52.
54. A lightning strike protection film comprising the electrically-conductive film of embodiment 53, wherein the electrically-conductive layer is in contact with a base layer comprising an epoxy.
55. A lightning strike protection film comprising the electrically-conductive film of embodiment 53, wherein the electrically-conductive layer is in contact with a base layer comprising a polysulfide, polythioether, or copolymer thereof.
56. A lightning strike protection film comprising the electrically-conductive film of embodiment 53, wherein the electrically-conductive layer is in contact with a base layer comprising a thermoplastic.
57. A lightning strike protection film comprising the electrically-conductive film of embodiment 53, wherein the electrically-conductive layer is in contact with a base layer comprising a fluoroelastomer.
58. The lightning strike protection film of any one of embodiments 54-57, wherein the base layer is a first base layer and further comprising a second base layer disposed on the first base layer, the second base layer comprising an epoxy, thermoplastic, fluoroelastomer, or polysulfide, polythioether, or copolymer thereof.
59. The lightning strike protection film of any one of embodiments 54-58, further comprising an adhesive layer in contact with a base layer, the electrically-conductive layer, or both.
60. A lightning strike assembly comprising the lightning strike protection film of any one of embodiments 54-59, disposed on a fiber-reinforced composite substrate.
61. A lightning strike assembly comprising the lightning strike protection film of any one of embodiments 54-59, disposed on a thermoplastic protective layer.
62. A composite part of an aircraft or wind turbine having the lightning strike protection film of claim 60 or 61 disposed thereon.

EXAMPLES

Objects and advantages of this disclosure are further illustrated by the following non-limiting examples, but the materials and amounts thereof recited in these examples, as well as other conditions and details, should not be construed to unduly limit this disclosure.

Unless otherwise noted, all parts, percentages, ratios, etc. in the Examples and the rest of the specification are by weight.

TABLE 1

Materials

| Designation | Description | Source |
|---|---|---|
| NC700 | A release agent available under the trade designation "LOCTITE FREKOTE 700NC" | Henkel Adhesive Technologies, Düsseldorf, Germany |
| Carbon Fabric prepreg | A carbon fiber fabric impregnated with epoxy resin, available under the trade designation "CYCOM 970 T300 3K-70-PW" | Cytec Industries Inc., Woodland Park, NJ |
| 6061 Aluminum | A general-purpose aluminum alloy with magnesium and silicon as its alloying elements | |
| AF163-2 | Epoxy adhesive film, available under the trade designation "SCOTCH WELD STRUCTURAL ADHESIVE FILM AF163-2" | 3M Co., St. Paul, MN |
| Pacur 7020 | Polypropylene film | Pacur, Oshkosh, WI |
| KANE ACE MX-257 | Liquid epoxy resin | Kaneka Corporation, Osaka, Japan |
| SR-833-5 | Diacrylate resin | Arkema, Colombes, France |
| CN147 | Acrylate oligomer | Arkema, Colombes, France |
| DAR 1173 | Photoinitiator | Novartis International AG, Basel, Switzerland |
| FPA | Fluorinated phosphonic acid | Made according to Example 2 of U.S. Pat. No. 6,824,882 (Boardman et al.) |
| Technic 89 | Tin sulfate plating composition | Technic, Inc., Cranston, RI |
| EPON 828 | Difunctional liquid epoxy resin | Hexion, Inc., Columbus, OH |
| AMICURE CG-1400 | Cyandiamine | Evonik Industries AG, Essen, Germany |
| AMICURE UR2T | Substituted urea-based cure accelerator | Evonik Industries AG, Essen, Germany |
| CAPCURE 3-800 | Mercaptan-terminated polymer liquid curing agent | Gabriel Performance Products LLC, Ashtabula, OH |
| CAPCURE 40 SEC HV | Mercaptan-based epoxy hardener | Gabriel Performance Products LLC, Ashtabula, OH |
| DEH-85 | Phenolic hardener based on a reaction product of liquid epoxy resin and bisphenol A | Dow Chemical Company, Midland, MI |
| THIOCURE TMPMP | Trimethylolpropane tri(3-mercaptopropionate) | Bruno Bock Chemische Fabrik GmbH & Co. KG, Marschacht, Germany |
| 5413 Polyimide Film Tape | Polyimide film tape | 3M Co., St. Paul, MN |
| 08193 Mixing Nozzle | Static mixing nozzle | 3M Co., St. Paul, MN |
| 250 Flatback tape | Flatback masking tape | 3M Co., St. Paul, MN |
| DP190 | 2-part epoxy adhesive | 3M Co., St. Paul, MN |
| DP100 | 2-part epoxy adhesive | 3M Co., St. Paul, MN |

Example 1

Fabricating an Epoxy Forming Tool

An aluminum master tool was fabricated by machining a sheet of 6061 aluminum to include topological features 104 (according to FIGS. 1 and 2), having a curvature radius R=0.07 mm, and dimensions (d+w)=0.81 mm, c=0.18 mm, and height h=0.10 mm. Two coats of NC700 were wiped onto aluminum master tool with a lint free cloth, allowing each coat to dry for at least 15 min.

Separately, 3 plies of a carbon fabric prepreg ("CYCOM 970 T300", available from Cytec) were cut large enough to cover the aluminum master tool (15 inches by 23 inches=38 cm by 58 cm) and were vacuum consolidated. To these consolidated layers was applied 2 layers of 6 mil (153 micrometers) thick epoxy "AF163-2" adhesive film and all the layers were vacuum consolidated to provide a consolidated construct having an exposed epoxy adhesive face.

A curing plate was coated with two 2 coats of NC700 release agent, wiping the curing agent on with a lint free cloth and allowing each coat to dry for about 15 minutes. The consolidated construct was placed onto the curing plate, with the adhesive face up (i.e., facing away from the curing plate). The aluminum master tool was placed against the exposed surface of the epoxy adhesive, with the structured side (i.e., face having the protrusions) facing down, against the epoxy adhesive.

The curing took place as follows. A 1 mil (25 micrometer) polytetrafluoroethylene non-perforated parting film (available from Northern Fiber Glass Sales, Inc. under the trade designation "HTF-621") was applied to the exposed surface of the aluminum master tool and affixed thereon with heat resistant tape applied at the edges and corners of the film. A non-woven polyester felt breather ply (10 oz/yd$^2$ (340 g/m$^2$), available under the trade designation "RC-3000-10" from Richmond Aircraft Products) was placed over the entire part.

A 3 mil (76 micrometers) high-temperature nylon bagging film (available under the trade designation "HS8171" from Richmond Aircraft Products) was placed loosely over the curing plate to cover the part and tools. At least 1 vacuum port assembly was installed in the vacuum bag over the breather ply and the vacuum bag was sealed to the bed of the autoclave with vacuum bag sealing tape. The construct was heated at 350° F. (177° C.) for 90 minutes. The cured epoxy embossing (forming) tool was removed, trimmed, and used further for forming a polypropylene tool.

Fabricating a Cured Polypropylene Tool from the Epoxy Forming Tool

A sheet of 15 mil (380 micrometers) thick PACUR 7020 polypropylene film was cut large enough to cover the above epoxy forming tool and was placed on the face of a curing plate. The exposed surface of the polypropylene film was wiped with isopropyl alcohol to remove any contaminates. The epoxy forming tool was placed on the polypropylene film, with the structured surface facing the polypropylene film.

The same curing procedure was carried out as for the fabrication of the epoxy forming tool, except for the heating temperature and duration; the construct including the polypropylene film was heated at 340° F. (171° C.) for 40 minutes. The cured polypropylene tool was removed and trimmed, and further coated as described below.

Metallizing the Polypropylene Tool

The cured polypropylene tool was first treated with an oxygen plasma at 70 mTorr (9.33 Pa), with a flow rate of 250 standard cubic centimeters per minute ("sccm"), a web speed of 12 ft/min (0.37 m/min) and a current of 0.185 A, using a vacuum web coater. A chromium layer was then applied at a pressure of 1.8 mTorr (0.24 Pa) of Argon, a web speed 22 ft/min (6.7 m/min), and a power setting of 0.7 kW. A copper layer was then applied in two passes, wherein the power was increased to 4.6 kW, the line speed was 6.5 ft/min, and the pressure was 1.7 mTorr (0.23 Pa). A nickel layer was then applied in two passes over the seed layer at a pressure of 5 mTorr (0.67 Pa), a web speed of 3 ft/min (0.91 m/min), and a power setting of 1.3 kW.

A layer of tin-bronze was then electroplated onto the nickel layer, giving an electroplated tin-bronze surface. A one-liter aqueous plating solution was prepared by mixing 7 grams sodium hydroxide, 60 grams sodium cyanide, 30 grams copper (II) cyanide and 74.15 grams sodium tin oxide trihydrate in deionized water at 21° C. until completely dissolved. The plating solution was transferred to a plating bath and heated to 60° C. A 4 by 5 inch by 2 mil (10.16 by 12.7 cm by 50.8 µm) electrically conductive metal coated polypropylene sheet described above was immersed in the plating solution. A current density of 5 A/dm$^2$, at a pulse rate of 2.5 msec on/20 msec off, was applied for approximately 30 minutes, while stirring the plating solution. The bronzed polypropylene sheet was removed from the plating solution, rinsed 3 times with deionized water and dried for 30 minutes at 21° C. ESCA and ICP analysis confirmed the sheet was uniformly coated with a 7 µm homogeneous bronze alloy of 77 atomic percent copper and 23 atomic percent tin.

Applying Epoxy Adhesive to the Metallized Tool

An epoxy adhesive "Part B" was prepared using the ingredients listed in Table 2, as follows: The CG-1400 and UR2T were stirred into the EPON 828 in a mixing cup. The mixture was spun in the high-speed mixer at 1500 rpm for 6 minutes. The mixture was manually stirred to remove accumulation on surfaces and then was spun again at 1500 rpm for 4 minutes. The MX-257 was added and the mixture was spun in the high-speed mixer at 1500 rpm for 2 minutes, and then cooled to room temperature.

TABLE 2

| Description | Parts by wt. |
| --- | --- |
| KANE ACE MX-257 | 66.47 |
| EPON 828 | 27.33 |

TABLE 2-continued

| Description | Parts by wt. |
| --- | --- |
| AMICURE CG-1400 | 4.10 |
| AMICURE UR2T | 2.10 |

Next, a mixture of AMICURE221 (used here as an epoxy adhesive "Part A") and the epoxy adhesive Part B (from Table 2 ingredients) was coated onto a release liner at a ratio of 1:2 with a 6 mil (about 150 micrometers) bar gap. The layer of epoxy adhesive (Part A+Part B) was immediately laminated to the electroplated metal surface and cured overnight at room temperature.

The electroplated metal layer, as coated with the cured epoxy, was easily peeled from the nickel layer. The results are shown in Table 4.

Example 2

A metallized polypropylene tool of EXAMPLE 1 was prepared, except that prior to the electroplating to add the tin-bronze layer, a 4 by 5 inch by 2 mil (10.16 by 12.7 cm by 50.8 micrometers) electrically conductive metal coated polypropylene sheet described above was immersed in the a solution of FPA at 20° C. for 5 minutes then rinsed with deionized water and dried 5 minutes at room temperature to form a polymer release layer, and then the electroplating was carried out to give the metallized polypropylene tool having the tin-bronze layer disposed on the polymer release layer.

Applying Epoxy Adhesive to the Metallized Tool

An epoxy adhesive composition "Part A" was prepared using the ingredients listed in Table 3, as follows: the CAPCURE 3-800, CAPCURE 40 SECHV, and DEH-85 were stirred together in a heat resistant mixing cup, using a high-speed mixer. The materials were warmed to 275° F. (135° C.) for 25 minutes. The mixture was stirred manually while still hot to remove accumulation on the surfaces, and then spun in the high-speed mixer at 1500 rpm for 2 minutes. The materials were warmed again to 275° F. (135° C.) for 15 minutes. The TMPMP was added and the mixture was spun in the high-speed mixer at 1500 rpm for 2 minutes, and then cooled to room temperature.

TABLE 3

| Description | Parts by wt. |
| --- | --- |
| CAPCURE 3-800 | 71.7 |
| CAPCURE 40 SEC HV | 14.7 |
| DEH-85 | 9.10 |
| THIOCURE TMPMP | 4.50 |

For this example, the epoxy adhesive "Part B" was same as that described in EXAMPLE 1.

A mixture of "Part A" and "Part B" was coated onto a release liner at a ratio of 1:2 with a 6 mil (about 150 micrometers) bar gap. The layer of epoxy adhesive (Part A+Part B) was immediately laminated to the electroplated metal surface and cured overnight at room temperature. The results are shown in Table 4.

Comparative Example 1

A metallized polypropylene tool of EXAMPLE 2 was prepared, except that prior to the electroplating to add the tin-bronze layer, no separation layer was created on the conductive seed layer before the electroplating was accomplished.

After the full construction was completed, an adhesion test of the plated layers to the adjacent layers was attempted. The electroplated metal layer would not separate from the seed layer to initiate the peel test. The results are shown in Table 4.

Example 3

Preparation of Sample Patches—Polypropylene Liner Samples

A patterned polypropylene liner having flat top pyramids (as in FIGS. 1 and 2) was cut to 6 inches (15 cm) by 10 inches (25 cm) patches, for patterned film samples. These patterned film samples served as working examples.
Applied a Conductive Seed Layer to the Polypropylene Patches.

Nickel/chrome and copper sputter targets were installed in an electrosputtering vacuum chamber. A roll of 2 mil (51 micrometer), 16 inch (41 cm) wide polyester carrier film was loaded into the vacuum chamber. Sample patches were attached to the center of the polyester carrier film using 1 inch (2.5 cm) wide 5413 Polyimide Film Tape. A full vacuum was pulled, and the web was run for multiple passes until the vacuum level stabilized at 0.8 mTorr (0.11 pA). The web was then treated with a nitrogen plasma at pressure of 2.1 mTorr (0.28 Pa) at a web speed of 5 feet/min (1.5 m/min). A nickel/chromium tie layer was electrosputtered onto the polypropylene web (argon gas, 2.1 mTorr (0.28 Pa), 76 sccm, web speed=85 ft/min (26 m/min), power=1.0 kW). The surface of the sample patches was then sputtered with conductive metal (copper target, argon gas, 1.7 mTorr (0.23 Pa), web speed=6 ft/min (1.8 m/min), power=4.5 kW).

A polymer release material was prepared by mixing 21 grams SR-833-5, 3 grams CN147, and 1 gram DAR 1173. The polymer release layer was applied while the polyester carrier roll, with the sample patches attached, was still loaded in the vacuum chamber and under a vacuum of 5.0 mTorr (0.67 Pa) at a web speed of 68 ft/min (21 m/min), at a flow of 0.4 mL/min of the polymer release material to form a 40 nanometer film and cured with UV lamps.
Electroplating with Tin and Copper.

Tin was next electroplated onto the polymer release layer on the sample patches, and then copper was electroplated copper onto the tin surface of the sample patches.

A one liter aqueous copper plating solution was prepared by mixing deionized water 60% by volume, 2.6 oz copper sulfate pentahydrate, and sulfuric acid to make 1 liter. A one liter aqueous tin plating solution was prepared by filtering 1 liter of Technic 89 matte tin through a 1 micrometer polypropylene filter for 12 hours. A 4×5 inch by 2 mil (10.16 by 12.7 cm by 50.8 micrometers) electrically conductive metal coated polypropylene sheet described above was immersed in the tin plating solution at a current density of 12 A/ft² for approximately 40 seconds, while agitating the plating solution. After rinsing, and without drying, the metal coated polypropylene sheet was immersed in the copper plating solution for approximately 40 minutes at a current density of 10 A/ft².
Test Sample Preparation for Polypropylene Patterned Liner Patches Epoxy adhesive Part A and Part B were prepared as in Example 2. The epoxy adhesives Part A and Part B were loaded into a 200 mL 2:1 MIXPAC cartridges. The plated samples were taped to a polyester carrier film which was loaded on a laminator. A 6 mil (0.15 mm) polypropylene top liner was loaded onto the laminator along with a 10 mil (0.25 mm) glass scrim. The scrim tracked with the polypropylene top liner through the coating nip while the plated patches were taped to the bottom liner going through the laminator nip. The laminator nip pressure was set at 20 psi (approximately 140 kPa). With both liners running at slow speed through the closed laminator nip, the epoxy was manually dispensed at a 1:2 volumetric ratio of Part A to Part B through a 08193 Mixing Nozzle into the bottom liner and allowed to pool in the laminator nip until the full width of the sample patch was covered. The sample patches were allowed to cure at room temperature overnight. The sample patches were then cut into 1 inch (2.5 cm) width strips. One inch (2.5 cm) wide 250 Flatback tape was adhered to the plated surface of the patches.

Adhesion of the plated layers to the release layer was tested on a IMass SP-2000 peel tester at 12 in/min (30 cm/min) using a 25 lb (11 kg) load cell, with a 2 second delay time.

The results are shown in Table 4.

Example 4

A polypropylene film (obtained from Loparex, Hammond, Wis.) was cut to 5.25 inch by 5.25 inch (13 cm by 13 cm) patches having a 10 mil (0.25 mm) thickness, for flat film samples. These flat film samples were carried through the same steps of applying a conductive seed layer, a polymer release layer, and electroplating with tin and copper as for the patterned samples of EXAMPLE 3. Adhesion testing was carried out as in EXAMPLE 3, with the result that the plated metal layers separated easily from the polymer release layer. The results are shown in Table 4.

Example 5

Flat polypropylene film sample patches and polypropylene patterned liner sample patches were prepared as in EXAMPLE 3. A conductive seed layer was applied to the patches, as described for EXAMPLE 3.

A copper oxide release layer was applied to the polypropylene patches, by sputtering a copper target in the presence of oxygen gas (argon flow=76 sccm; oxygen flow=13 sccm; pressure=76 mTorr (10 Pa); web speed=30.0 ft/min (9.1 m/min); power=4.5 kW).

The sample patches were then electroplated with tin, and then with copper, as in EXAMPLE 3. Adhesion of the plated layers to release surface was tested as described in EXAMPLE 3.

The results are shown in Table 4.

Example 6: Oxidized Copper Separation Layer

Flat polypropylene film sample patches and polypropylene patterned liner sample patches were prepared as in EXAMPLE 3. A conductive seed layer was applied to the patches, as described for EXAMPLE 3 (under argon gas—no oxygen gas added during application of conductive seed layer).

The copper seed layer was then oxidized to form a copper oxide release layer using an oxygen plasma generator in the sputter coater. The copper seed layer was oxidized while the polyester carrier roll, with the sample patches attached, was still loaded in the vacuum chamber and under vacuum without relieving the vacuum (oxygen gas flow at 2.1 mTorr (0.28 Pa), web speed=20.0 ft/min (6.1 m/min))

The sample patches were then electroplated with tin, and then with copper, using the procedures described for EXAMPLE 3. Adhesion of the plated layers to release surface was tested as described in EXAMPLE 3.

The results are shown in Table 4.

Example 7

The surface of a 0.75 mil (19 micrometers) thick copper foil was immersed in DOW PREPO SIT 748, a persulfate & sulfuric acid etch, to remove surface oxides and contaminants, and then rinsed with deionized water. The copper foil was then immersed in a second solution composed of deionized water, 9% by volume (v %) hydrogen peroxide, and 0.5 v % phosphoric acid for a period of 2 minutes and rinsed in deionized water.

The copper foil was electroplated with tin by immersing in the tin plating solution described in EXAMPLE 3 at a current density of 12 A/ft² for approximately 40 seconds, while agitating the plating solution. After rinsing, and without drying, the copper foil was immersed in the copper plating solution described in EXAMPLE 3 for approximately 40 minutes at a current density of 10 A/ft². After rinsing, and without drying, the copper foil was immersed in the tin plating solution described in EXAMPLE 3 at a current density of 12 A/ft² for approximately 40 seconds.

The plated foil was gently removed from the copper substrate surface, resulting in a delicately thin conductor.

The results are shown in Table 4.

Example 8

EXAMPLE 7 was repeated with the following modification. The copper foil was pressed against a structured or knurled surface to create 3D structures onto the copper foil. The "structured" copper foil was coated with a flexible epoxy DP190 epoxy and cured at RT for 24 hrs. The surface of this copper epoxy composite sheet was then treated and plated using the procedures described in EXAMPLE 7. After plating, an epoxy, DP100, was applied to the plated foil and cured for 1 hour. The epoxy/plated foil composite was gently removed from the copper substrate surface resulting in a composite having a delicately thin structured conductor.

Example 9

EXAMPLE 7 was repeated with the following modification. The copper foil seed layer was coated in selected regions with a masking agent. 3M DP 100 was used as a quick setting masking agent, although others may be used, to create a patterned surface (see FIG. 7). The exposed surface of this copper foil was then treated and plated as described in EXAMPLE 7. The plated foil was gently removed from the copper substrate surface resulting in a delicately thin conductor. (see FIG. 8).

TABLE 4

| | | Results | |
|---|---|---|---|
| Example | Peel (oz/inch) | Release Layer Material | Seed Layer Character |
| 1 | <1> | nickel | structured |
| 2 | <2> | polymer separation material | structured |
| 3 | 1.0 | polymer release material | structured |
| 4 | <0.5 | polymer release material | flat |
| 5 | <0.5 | sputtered copper oxide | structured |
| 6 | 1.0 | oxidized copper | structured |
| 7 | <0.5 | oxidized copper | flat |
| 8 | <0.5 | oxidized copper | structured |
| 9 | <3> | oxidized copper | masked |
| Comparative 1 | Unable to peel apart without fracturing plated electrical conductor | None | structured |

<1> Separated by hand, Clean separation, but tight peel

<2> Separated by hand. Clean separation but shocky peel.

<3> Separated by hand. Removed cleanly without tearing.

All cited references, patents, and patent applications in the above application for letters patent are herein incorporated by reference in their entirety in a consistent manner. In the event of inconsistencies or contradictions between portions of the incorporated references and this application, the information in the preceding description shall control. The preceding description, given to enable one of ordinary skill in the art to practice the claimed disclosure, is not to be construed as limiting the scope of the disclosure, which is defined by the claims and all equivalents thereto.

What is claimed is:

1. A method of making an electrically-conductive film, the method comprising:

providing a release layer with a release surface, the release surface being a topologically structured surface;

depositing at least one electrically-conductive layer on the release layer by electrolytic plating, whereby the at least one electrically-conductive layer has an outer surface that substantially replicates the release surface; and peeling the at least one electrically-conductive layer away from the release layer to obtain the electrically-conductive film,
wherein the electrically-conductive layer comprises a copper-tin alloy or a copper-tin layered film, and the release layer comprises nickel, a metal oxide, or a polymeric surface.

2. The method of claim 1, further comprising depositing a base layer on the at least one electrically-conductive layer, wherein the base layer and the at least one electrically-conductive layer are peeled away from the release layer collectively.

3. The method of claim 2, wherein the base layer comprises a thermoplastic layer.

4. The method of claim 2, wherein the base layer comprises a curable layer and wherein the curable layer is at least partially cured prior to peeling the base layer and the at least one electrically-conductive layer away from the release layer.

5. The method of claim 1, wherein providing the release layer with the topologically structured surface comprises vacuum depositing the release layer, or precursor thereof, on the topologically structured surface.

6. The method of claim 5, wherein vacuum depositing the release layer, or precursor thereof, on the topologically structured surface comprises:
providing a seed layer on the topologically structured surface; and
vacuum depositing the release layer, or precursor thereof, on the seed layer;
and optionally depositing a mask on the seed layer before or after the release layer is deposited.

7. The method of claim 6, wherein the seed layer comprises a metal and the release layer comprises nickel.

8. The method of claim 6, wherein the seed layer comprises a metal and the release layer comprises a metal oxide.

9. The method of claim 6, wherein the metal oxide comprises copper oxide.

10. The method of claim 5, wherein the release layer comprises metal oxide and wherein vacuum depositing the release layer, or precursor thereof, on the topologically structured surface comprises:
vacuum depositing an electrically-conductive seed layer on the topologically structured surface; and
oxidizing the seed layer; and
optionally, depositing a mask on the seed layer before or after the seed layer is oxidized.

11. The method of claim 10, wherein the electrically-conductive seed layer comprises copper and the metal oxide comprises copper oxide.

12. The method of claim 1, wherein the release layer comprises metal oxide, the topologically structured surface comprises a metal, and wherein the metal oxide is obtained by oxidizing the surface of the topologically structured surface.

13. The method of claim 12, wherein the metal comprises copper and the metal oxide comprises copper oxide.

14. A method of making an electrically-conductive film, the method comprising:
providing an electrically-conductive seed layer having a major surface, wherein selected portions of the major surface are placed in contact with a masking layer;
depositing a release layer on a portion of the major surface not contacted by the masking layer;
depositing at least one electrically-conductive layer on the release layer whereby the at least one electrically-conductive layer is selectively deposited on portions not covered by the masking layer; and
peeling the at least one electrically-conductive layer away from the release layer to obtain the electrically-conductive film.

15. A method of making an electrically-conductive film, the method comprising:
providing a release layer with a release surface, the release surface being a topologically structured surface;
depositing at least one electrically-conductive layer on the release layer whereby the at least one electrically-conductive layer has an outer surface that substantially replicates the release surface; and
peeling the at least one electrically-conductive layer away from the release layer to obtain the electrically-conductive film, wherein the release layer comprises metal oxide and providing the release layer with a topologically structured comprises embossing a formable layer against a topologically structured substrate.

16. The method of claim 15, wherein the formable layer comprises copper and the metal oxide comprises copper oxide.

17. The method of claim 16, wherein the release layer comprises a polymeric surface.

* * * * *

UNITED STATES PATENT AND TRADEMARK OFFICE
CERTIFICATE OF CORRECTION

| | | |
|---|---|---|
| PATENT NO. | : 11,648,761 B2 | Page 1 of 1 |
| APPLICATION NO. | : 16/771836 | |
| DATED | : May 16, 2023 | |
| INVENTOR(S) | : Larry Stephen Hebert et al. | |

It is certified that error appears in the above-identified patent and that said Letters Patent is hereby corrected as shown below:

In the Claims

<u>Column 26</u>
Line 38, In Claim 15, after "structured", insert --surface--.

Signed and Sealed this
Nineteenth Day of September, 2023

Katherine Kelly Vidal
*Director of the United States Patent and Trademark Office*